(12) United States Patent
Bao et al.

(10) Patent No.: US 8,691,023 B2
(45) Date of Patent: Apr. 8, 2014

(54) METHODS AND APPARATUS FOR CLEANING DEPOSITION CHAMBER PARTS USING SELECTIVE SPRAY ETCH

(75) Inventors: Liyuan Bao, Freemont, CA (US); Samantha S. H. Tan, Fremont, CA (US); Anbei Jiang, Sunnyvale, CA (US)

(73) Assignee: Quantum Global Technologies, LLP, Dublin, PA (US)

( * ) Notice: Subject to any disclaimer, the term of this patent is extended or adjusted under 35 U.S.C. 154(b) by 0 days.

(21) Appl. No.: 13/585,294

(22) Filed: Aug. 14, 2012

(65) Prior Publication Data

US 2013/0037062 A1 Feb. 14, 2013

Related U.S. Application Data

(62) Division of application No. 12/146,676, filed on Jun. 26, 2008, now abandoned.

(60) Provisional application No. 60/946,983, filed on Jun. 28, 2007.

(51) Int. Cl.
*B08B 3/00* (2006.01)

(52) U.S. Cl.
USPC .......... 134/28; 134/2; 134/3; 134/18; 134/26; 134/34

(58) Field of Classification Search
None
See application file for complete search history.

(56) References Cited

U.S. PATENT DOCUMENTS

| | | |
|---|---|---|
| 6,505,636 B1 | 1/2003 | Travis |
| 6,770,424 B2 | 8/2004 | Mandal et al. |
| 6,810,298 B2 | 10/2004 | Emoto |
| 6,812,471 B2 | 11/2004 | Popiolkowski et al. |
| 6,902,627 B2 | 6/2005 | Brueckner et al. |
| 6,933,508 B2 | 8/2005 | Popiolkowski et al. |
| 2004/0000327 A1 | 1/2004 | Somboli et al. |
| 2004/0099285 A1 | 5/2004 | Wang et al. |
| 2004/0211449 A1 | 10/2004 | Yokomoto et al. |
| 2005/0048876 A1 | 3/2005 | West et al. |
| 2005/0172984 A1 | 8/2005 | Schweitzer et al. |
| 2006/0012916 A1* | 1/2006 | Sasaki et al. .................. 360/126 |
| 2006/0124155 A1 | 6/2006 | Suuronen et al. |
| 2006/0220329 A1 | 10/2006 | Dolechek et al. |
| 2006/0237054 A1 | 10/2006 | Somboli et al. |
| 2007/0000521 A1 | 1/2007 | Fury et al. |
| 2007/0131255 A1 | 6/2007 | Cox et al. |

FOREIGN PATENT DOCUMENTS

| | | |
|---|---|---|
| EP | 1143036 A2 | 10/2001 |
| EP | 2 011 897 A2 | 1/2009 |
| KP | 10 2005 0086825 | 8/2005 |
| KP | 10 2007 00263969 | 3/2007 |
| WO | 2009005742 A1 | 1/2009 |

OTHER PUBLICATIONS

Communication from European Patent Office dated Sep. 23, 2011 for EP 11175407.3-2122 with Extended Search Report completed Sep. 15, 2011.

(Continued)

*Primary Examiner* — Eric Golightly

(74) *Attorney, Agent, or Firm* — Fox Rothschild LLP

(57) ABSTRACT

In one aspect, a method of cleaning an electronic device manufacturing process chamber part is provided, including a) spraying the part with an acid; b) spraying the part with DI water; and c) treating the part with potassium hydroxide. Other aspects are provided.

10 Claims, 7 Drawing Sheets

(56) References Cited

OTHER PUBLICATIONS

Partial European Search Report of European Patent Application No. EP 08 15 9251 (12260/EPC) issued on Sep. 30, 2008.

International Search Report and Written Opinion of International Application No. PCT/US2008/008065 (12260/PCT) mailed on Oct. 3, 2008.

Extended European Search Report of European Patent Application No. EP 05 15 9251 (12260/EPC) issued on Jan. 29, 2009.

* cited by examiner

METHODS AND APPARATUS FOR CLEANING DEPOSITION CHAMBER PARTS USING SELECTIVE SPRAY ETCH

The present application is a division of U.S. application Ser. No. 12/146,676, filed Jun. 26, 2008 now abandoned and entitled "METHOD AND APPARATUS FOR CLEANING DEPOSITION CHAMBER PARTS USING SELECTIVE SPRAY ETCH," which claims priority to U.S. Provisional Patent Application Ser. No. 60/946,983 filed Jun. 28, 2007 and entitled "TANTALUM/TANTALUM NITRIDE STRIPPING OF CHAMBER PARTS USING SELECTIVE ETCHING". The contents of each of these applications are hereby incorporated herein by reference in their entirety for all purposes.

RELATED APPLICATIONS

Co-owned U.S. Pat. No. 6,812,471, filed Jul. 17, 2003 and entitled "METHOD OF SURFACE TEXTURING", is hereby incorporated by reference herein in its entirety and for all purposes.

Co-owned U.S. Pat. No. 6,933,508, filed Mar. 13, 2002 and entitled "METHOD OF SURFACE TEXTURING", is hereby incorporated by reference herein in its entirety and for all purposes.

FIELD OF THE INVENTION

The present invention relates generally to electronic device manufacturing and is more particularly directed to the cleaning of process chamber components.

BACKGROUND OF THE INVENTION

In semiconductor, flat panel and solar power panel manufacturing processes, various films are deposited on the surfaces of substrates. In the course of processing the substrates, equipment (and/or the chambers) used to deposit the films may also become unintentionally coated in the deposited film. Often an in-situ cleaning process may be used to maintain a clean and consistent chamber environment. However, sometimes an in-situ cleaning is not possible, or is no longer effective. At these times, the film-covered equipment components may need to be removed and cleaned.

SUMMARY OF THE INVENTION

In one aspect a method of cleaning an electronic device manufacturing process chamber part is provided, including a) spraying the part with an acid; b) spraying the part with DI water; and c) treating the part with potassium hydroxide.

In another aspect, a spray cleaning apparatus for components of an electronic device manufacturing process chamber is provided, including: a) a support member; b) a spray nozzle attached to the support member; c) a cleaning chemistry supply; and e) a conduit adapted to convey cleaning chemistry from the cleaning chemistry supply to the spray nozzle; wherein the spray nozzle attached to the support member is adapted to rotate and to move linearly and is adapted to direct a spray of cleaning chemistry to the interior of an electronic device manufacturing process chamber component from a plurality of directions.

In yet another aspect, a spray cleaning apparatus for components of an electronic device manufacturing process chamber is provided which includes: a) a cleaning tank; b) a plurality of spray nozzles connected to an arm; c) a mounting device adapted to hold a process chamber component inside the tank; and d) a cleaning chemistry supply connected to the spray nozzles; wherein the arm is adapted to move the spray nozzles to direct a spray of cleaning chemistry at the chamber component from a plurality of directions.

Numerous other aspects are provided in accordance with these and other aspects of the invention. Other features and aspects of the present invention will become more fully apparent from the following detailed description, the appended claims and the accompanying drawings.

DETAILED DESCRIPTION

In order to recondition process chamber components, the components may be dipped into an acid bath to remove an unintentional coating or film. The acid bath dip, however, may result in a violent reaction which may be undesirable. Also, a tremendous amount of heat may be produced by the reaction so that a chiller may be needed to cool the process to an operating temperature at which the equipment is not over heated.

Additionally, the unintentional coating on the equipment may not be even. For example, in the case of physical vapor deposition (PVD) chambers, there may be a source or target material at the top of the chamber, a substrate at the bottom and shields which extend from the target to the substrate around the interior of the chamber. The top of the shields near the target or source may accumulate a thicker, denser coating than the bottom of the shields near the substrate. When a dipping clean process is used, very often the thick areas of film accumulation may not be fully cleaned while the thin areas may be over-etched. Over-etching may damage the shields and may cause future unintentional coatings to shed onto a substrate being processed. Shedding of particles onto a substrate may cause defects in the substrate that may render the substrate inoperative. Hence, contamination control is a major issue for manufacturers of semiconductor devices, flat panel displays and solar power panels.

While the above example pertains to the shields of a PVD chamber, it will be appreciated that other chamber components (such as shadow rings, contact rings, clamp rings, substrate supports, showerheads, faceplates, etc.) from other deposition processes (including chemical vapor depositions (CVD) and electroplating) may accumulate unintentional coatings that periodically require ex-situ cleaning. Likewise, etching processes (such as reactive ion etching, sputter etching and electroetching) may also result in an accumulation of etching by-product films on the chamber components that may require ex-situ cleaning.

The present invention provides methods and apparatus for cleaning coatings from the surfaces of processing equipment. The applicants have discovered that by spraying a cleaning chemistry onto a part, rather than by dipping the part into the cleaning chemistry, enhanced cleaning of processing equipment parts may be obtained. The enhanced cleaning may be obtained with less etching of the parts themselves and with less etching of any intentional coating of the part. Following the spraying of the cleaning chemistry onto the part, the part may then be pressure washed with DI water, for example, and then may be treated with potassium hydroxide. Finally, the part may be re-rinsed with the DI water.

FIGS. 1A-1E are a schematic illustration of a method for cleaning (or reclaiming) a process-film coated component according to one of the embodiments of the invention.

Figure 1A:
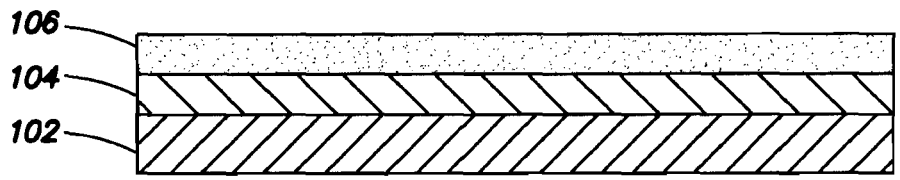
FIGS. 1A-E are a schematic illustration of a method for cleaning or reclaiming a process film coated component according to one of the embodiments of the invention.

The starting point in FIG. 1A may be a chamber component 102. A chamber component may be made from aluminum, stainless steel or a ceramic. For the purposes of this example, the chamber components may be made from aluminum.

Typically, new chamber components 102 may be intentionally covered with a coating 104. This may be referred to herein as an "intentional coating." The coating may, for example, be a protective layer, or a layer which gives the component proper electrical properties in order to be compatible with a plasma environment. In addition, the coating may minimize contamination of substrates within the chamber. One intentional coating 104 is a twin wire arc spray ("TWAS") coating of aluminum, copper, nickel, molybdenum, or zinc, for example. Other intentional coatings may be used. As the name suggests, the TWAS coating process may include two wires which form an electric arc. Molten metal which results from the arcing metal wires may be atomized by compressed air and sprayed upon a component to form a coating. The resulting intentionally coated component may have a roughness which promotes adhesion of PVD materials to the component. This may help prevent unintentionally coated PVD materials from breaking off and contaminating the surface of a substrate. Other components, such as the ones listed earlier, may also be coated by a TWAS processes. Likewise, adhesion of other process materials (such as, for example, CVD films, and etching by-products, etc., as discussed earlier) may be enhanced by the TWAS or other intentional coating.

The next layer may be the accumulated process material layer or unintentional coating 106. Depending upon the equipment, and/or the processes run on the equipment, the unintentional coating material may vary. Common accumulated process films in PVD equipment may include copper (Cu), ruthenium (Ru), aluminum (Al), titanium (Ti) and/or titanium nitride (TiN), titanium tungsten (TiW) and tantalum (Ta) and/or tantalum nitride (TaN). Unintentional coatings on etching equipment are usually polymeric. Unintentional coatings on CVD chambers may be silicon dioxide, silicon nitride, silicon oxynitride, silicon carbon, doped silicon oxides, oxygenated silicon carbon films (often referred to as SiCOH).

Figure 1B:
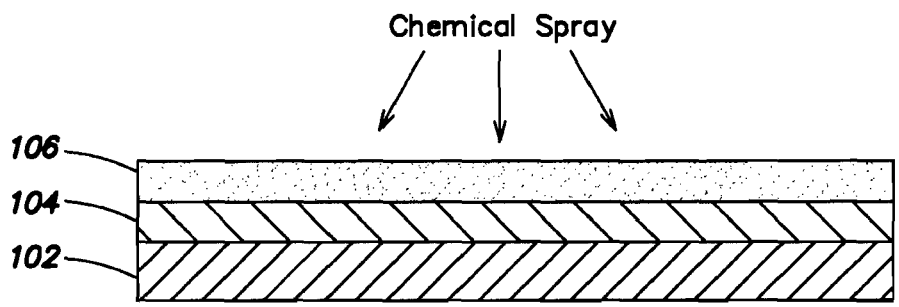
Figure 1C:
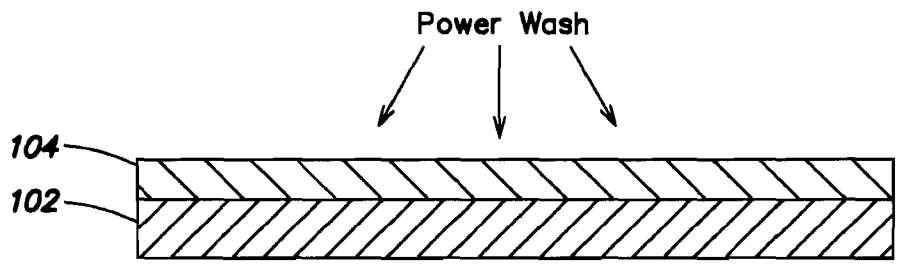

In FIG. 1B the first cleaning or reclaiming step takes place. Here the chamber component 102 with intentional 104 and unintentional 106 coatings or films is exposed to a cleaning chemistry spray. This cleaning chemistry spray may preferentially remove or etch the unintentional coating 106 as compared to the intentional coating 104 and/or chamber component material itself. Continuing with the PVD shield example, the unintentional coating 106 may be TaN/Ta and the intentional layer 104 may be a TWAS deposited aluminum layer on an aluminum chamber component 102. Spraying the cleaning chemistry on the component, as opposed to dipping the component in the cleaning chemistry, may have several advantages. First, with a spray, the direction of the chemical can be more readily controlled. Therefore, areas with thick unintentional coating (such as the top of a PVD shield) can be exposed to a chemical for a longer time than areas of thin unintentional coating. Accordingly, the thick areas of unintentional coating may be completely or substantially cleaned without over-etching the thin areas of unintentional coating. For example, it may take only 30 minutes to remove a thin unintentional coating, whereas it may take about 2 hours to remove a thick or dense unintentional coating. Additionally, spraying a chemical may use less chemical than dipping into a chemical bath uses. For example, a spray process may use a few gallons of chemical (which can be collected and recycled via an automated spray system) whereas a bath may use 20 gallons of chemical. A spray process also generates less heat than a dipping bath process and therefore, the spray process may be safer and the use of a chiller may not be required in spray systems.

In some embodiments of the present invention, portions of a chamber component which have not accumulated unintentional coating may be masked so that the cleaning chemistry spray will not etch the chamber component or the intentional coating.

The spray chemistry may vary depending upon the identity of the unintentional film 106, the intentional film 104 and the substrate 102. For the example of a PVD Al shield with an Al TWAS layer and a TaN/Ta unintentional coating, an effective selective chemistry may be 15:85 ratio of hydrogen fluoride (HF) to nitric acid ($HNO_3$) or the same ratio of hydrogen chloride (HCl) to nitric acid ($HNO_3$). The nitric acid may be commercial grade which may provide a cost benefit. The ratio may vary somewhat, a 20:80 ratio of the same constituents may also be effective for selective stripping of TaN/Ta from an Al coating or component.

One of ordinary skill in deposition chamber cleaning will be able to select a chamber cleaning spray chemistry based upon the nature of the unintentional 106 and intentional 104 coatings and the material which forms the substrate 102.

After completion of the process in step 1B, the majority, if not all of the unintentional coating 106 may be removed from the thickly accumulated areas (top of the shield near a source/target, for example), while the thinly coated areas may not be over-etched.

In step 1C, the component is power washed with DI water to remove the cleaning chemistry and perhaps to remove some (if any exists) of the remaining unintentional coating 106 (TaN/Ta, for example). The pressure of the pressure washing step can vary widely, from 500 to 2000 p.s.i. However, it is expected that for most applications, 1000 p.s.i will suffice.

Figure 1D:
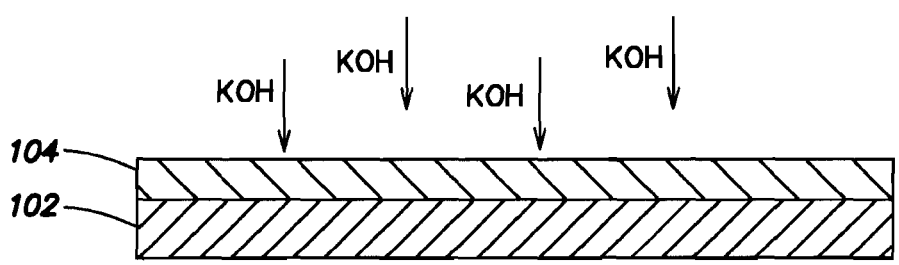

In FIG. 1D, the intentional coating 104 (TWAS Al, for example) is removed with a dilute potassium hydroxide (KOH) mixture. The degree of dilution may vary from about 6% KOH up to 25% KOH. The KOH may be sprayed on the component, or the component may be dipped in a bath of KOH. Likewise, if any of the unintentional coating 106 remains on the chamber component 102, it is expected that the KOH step will under-cut the fragmented unintentional coating 106. Such undercutting may help to remove any remaining fragmented unintentional coating 106. For a component the size of a PVD shield it is expected to take about 60 to 90 minutes to remove the intentional coating 104 with a dilute KOH treatment. The component may be washed with DI water at about 40 p.s.i following the KOH treatment.

Figure 1E:

In FIG. 1E the cleaned component (PVD shield, for example) is ready for grit-blasting and an application of a new intentional layer 106 (TWAS Al, in the example of a PVD shield) so that the component can be re-installed in a processing chamber. Details of the grit-blasting process and deposition of the intentional layer can be found in commonly owned U.S. Pat. No. 6,812,471 by Popiolkokwski et al., filed on Jul. 17, 2003, and U.S. Pat. No. 6,933,508 also by Popiolkokwski et al., filed on Mar. 13, 2002, which are incorporated herein in their entireties for all purposes.

Figure 2:
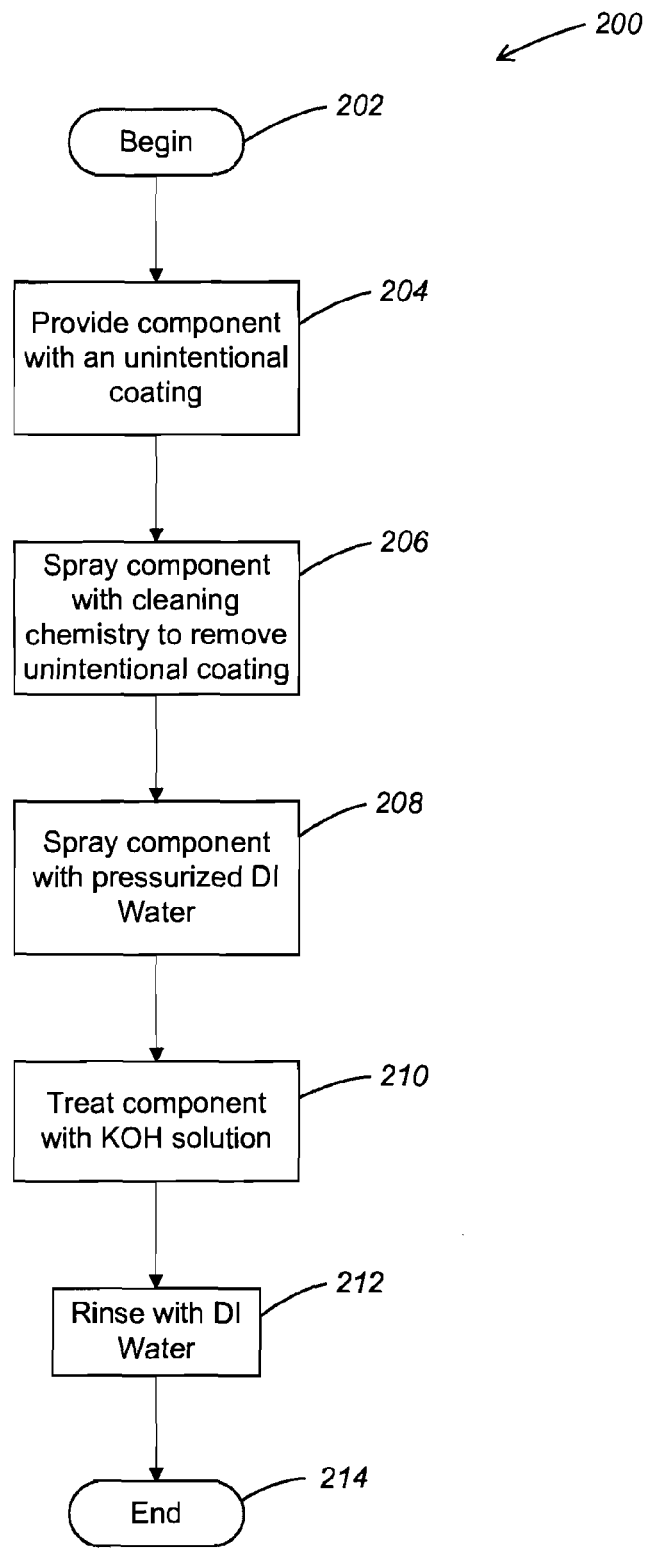
FIG. 2 is a flow diagram of a cleaning method of the invention.

FIGS. 1A-1E illustrate a cleaning method of the invention and its effect on a surface of a component. FIG. 2 is a flow diagram of one embodiment of the cleaning method 200 of the invention. Method 200 begins in step 202. In step 204, a component to be cleaned is provided wherein the component has an unintentional coating. The unintentional coating corresponds to layer 106 of FIGS. 1A-E. The cleaning process may also be thought of as a reclaiming process or a stripping process. The component may also have an intentional coating on it located on the component but beneath the unintentional coating. The intentional coating corresponds to layer 104 as discussed with reference to FIGS. 1A-E.

In step 206 of FIG. 2, the component having an unintentional coating is sprayed with a cleaning chemistry. The cleaning chemistry may be a selective chemistry whereby the cleaning chemistry may etch the unintentional coating 106 faster than it etches the intentional coating 104. Alternatively, if an intentional coating 104 is not present, the selective chemistry may etch the unintentional coating faster than it etches the component. The chemistry used would be the same as explained in conjunction with FIG. 1B. After step 206, most if not all of the accumulated layer will be removed from the component.

In step 208, the component is sprayed with high pressure DI water. The pressure washing removes the chemicals from step 206 and may loosen and remove any unintentional coating material remaining after step 206.

In step 210, the component is exposed to a dilute KOH mixture. The mixture concentration is as explained in conjunction with FIG. 1D. The mixture may be sprayed on the component or the component may be dipped in a bath of KOH. If the spray method is used, the KOH treatment may occur in the same apparatus. Alternatively, the component may be moved to a separate apparatus to receive KOH treatment (either spray or bath). The KOH treatment may strip the intentional coating from the component. If the component does not have an intentional coating (104 of FIG. 1), then step 4 may be omitted.

In step 212, the component may be rinsed with DI water following the treatment with KOH.

Finally, in step 214, the newly cleaned component is ready to be reconditioned. The reconditioning process may include grit blasting the component and the application of a new intentional coating. Reconditioning processes are discussed in more detail in commonly owned U.S. Pat. No. 6,812,471 by Popiolkokwski et al., filed on Jul. 17, 2003, and U.S. Pat. No. 6,933,508 also by Popiolkokwski et al., filed on Mar. 13, 2002, which have been previously incorporated herein by reference.

Figure 3:
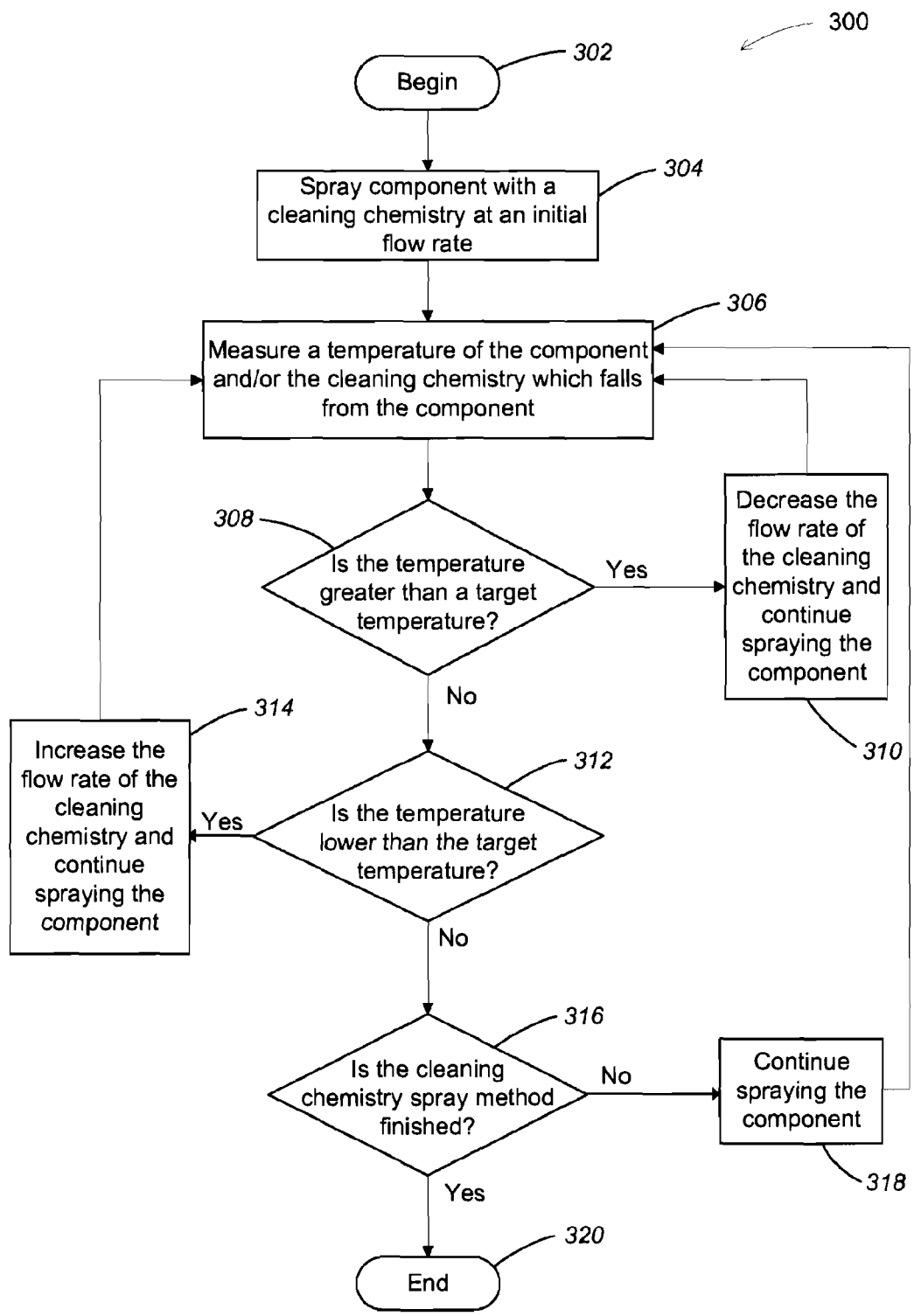
FIG. 3 is a flow diagram of a method of controlling chamber component temperature during cleaning chemistry spraying.

FIG. 3 is a flow diagram which depicts a method 300 of the invention for controlling the temperature of a chamber component while the component is being sprayed with a cleaning chemistry. An example of such a spraying step may be step 206 of FIG. 2. The method begins in step 302. In step 304 the chamber component is sprayed with a cleaning chemistry at an initial flow rate. The initial flow rate may be based upon an operator's judgment or may be based upon prior experience spraying similar components with similar cleaning chemistries.

In step 306, a temperature of the chamber component is measured. Alternatively, the temperature of the cleaning chemistry may be measured as it drains from a cleaning tank. In step 308, the measured temperature is compared to a target temperature or temperature range.

The target temperature or range may be selected to increase the etch rate of the unintentional coating 106 and to decrease the etch rate of the intentional coating 104 and/or the chamber component material 102. Another way to state this is that a target temperature range may be selected to obtain an acceptably high etch rate of the unintentional coating 106 and an acceptably low etch rate of the intentional coating 104 and/or the chamber component material 102. Thus, for any given cleaning chemistry, two curves may be drawn: one which plots unintentional coating etch rate versus temperature, and the other which plots intentional coating and/or chamber component etch rate versus temperature. A temperature range may then be chosen which gives acceptable etch rates of the unintentional coating 106, the intentional coating 104, and the chamber component material 102.

If the measured temperature is found to be greater than the target temperature range in step 308, the method may pass to step 310 in which the flow rate of the cleaning chemistry is decreased, and the spraying of the chamber component is continued. The method then passes back to step 306 where the temperature is re-measured.

In step 308, if the temperature is found not to be greater than the target temperature range the method may pass to step 312 where the measured temperature is again compared to the target temperature range. If the measured temperature is found in step 312 to be lower than the target temperature range the method may pass to step 314. In step 314, the flow rate of the cleaning chemistry is increased and the spraying of the chamber component is continued. From step 314 the method passes back to step 306 where the temperature is re-measured.

If in step 312, the measured temperature is found to be within the target temperature range, the method may pass to step 316 in which a determination is made whether the step of spraying the chamber component with cleaning chemistry is complete. The decision whether the step of spraying the chamber component with cleaning chemistry is complete may be based upon a duration of spraying, an observation of the chamber component, or on any other suitable method of determining whether the chamber component has been cleaned of all, or a substantial portion of, the unintentional coating 106.

If, in step 316, it is determined that the cleaning chemistry spray step is not finished, the method may pass to step 318 where the spraying of the component with the cleaning chemistry is continued. The method may then pass to step 306, and the method continued until such time as a determination is made in step 316 that the cleaning chemistry spray step is finished. At such time the method may pass to step 320 where the method ends.

The method 300 of FIG. 3 may be used to accomplish step 206 in method 200 of FIG. 2.

Figure 4:
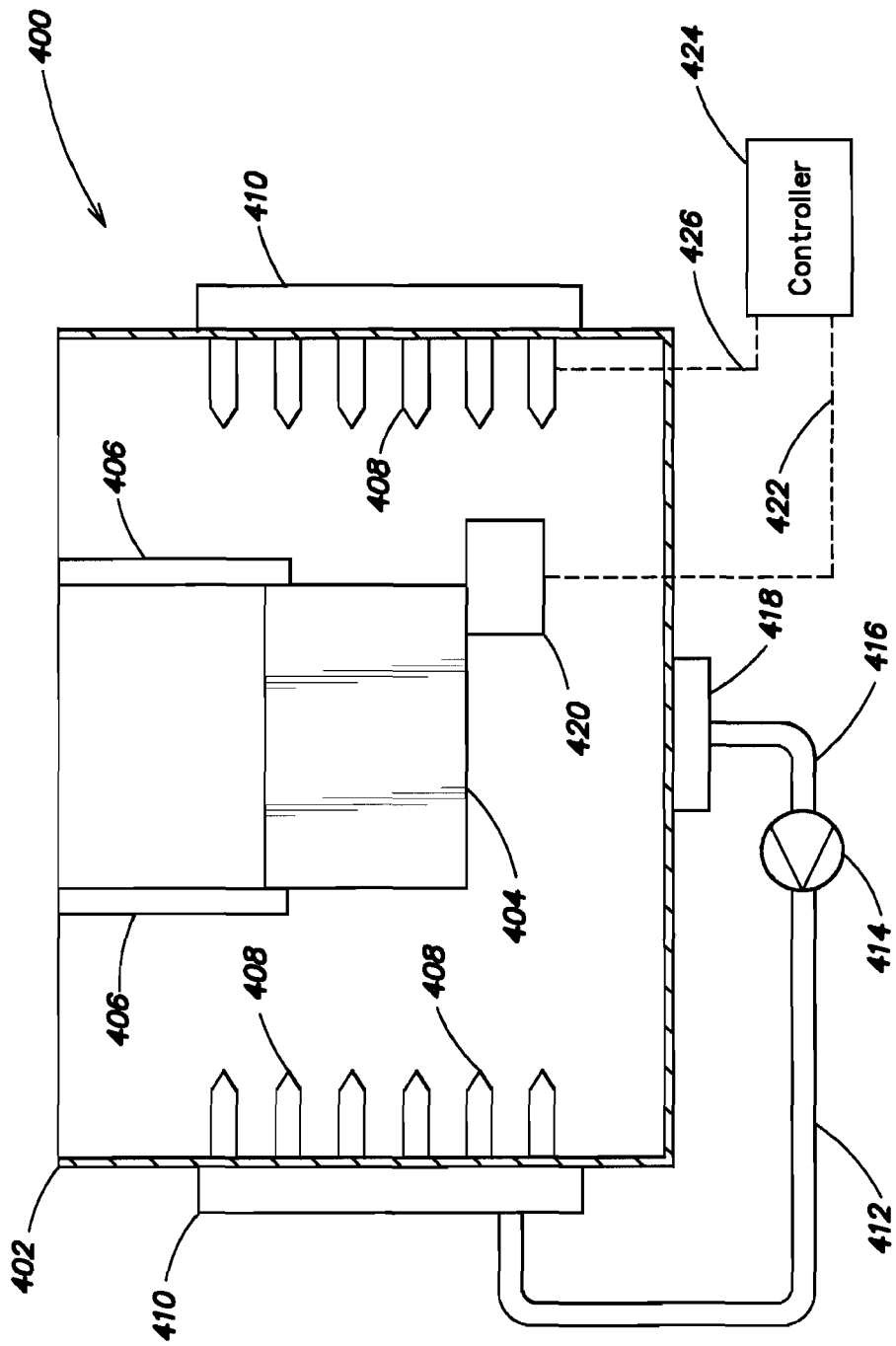
FIG. 4 is a schematic drawing of a chamber component spraying apparatus of the invention.

FIG. 4 is a schematic drawing of a chamber component spraying apparatus 400 of the invention. Spraying apparatus 400 may be used to perform any spraying step described herein. The spraying apparatus 400 may be a tank 402 or the like which completely encloses a component to be cleaned 404 as shown in FIG. 4. Alternatively, the apparatus may appear to be an open tank with a fume hood above it. The tank 402 may be used to clean one chamber component 404 at a time if the chamber component 404 is a large component. Alternatively, tank 402 may be used to clean a plurality of components simultaneously if each of the plurality of components is small enough to fit within the tank 402 and small enough to allow the plurality of components to be effectively sprayed with cleaning chemistry without the plurality of components interfering with each other. Spraying apparatus 400 may also include component holding devices 406. Component holding devices 406 may be hooks, tabs, shelves or any devices suitable to hold a chamber component. Component holding devices 406 may be made of any material which is impervious, or resistant, to the cleaning chemistries which are used to clean the chamber components.

Spraying apparatus 400 may include spray nozzles 408 which are depicted in FIG. 4 as located along the left and right sides of the tank 402. It will be understood that spray nozzles 408 may be located on any interior surface of tank 402 or alternatively spray nozzles 408 may be suspended within tank 402. Spray nozzles 408 may be connected to cleaning chemistry supplies 410, which may in turn be connected to cleaning chemistry recycle conduit 412. Although conduit 412 is shown as connected to only one cleaning chemistry supply 410, it will be understood that a similar connection may be made with the other depicted cleaning chemistry supply 410. One or more cleaning chemistry supplies 410 may be used.

Conduit 412 may be connected to pump 414 which in turn may be connected to conduit 416 and drain 418. Spraying apparatus 400 may also include a sensor 420 which may be adapted to measure the temperature of chamber component 404 and/or the temperature of any cleaning chemistry which flows into drain 418. Sensor 420 may be connected through signal line 422 to controller 424. Controller 424 may be connected through signal line 426 to nozzles 408. Although signal line 426 is shown connecting to a single nozzle 408, it will be understood that signal line 426 may be connected to any and all of the nozzles 408.

In operation, chamber component 404 may be suspended or held in place by component holding devices 406. Once chamber component 404 has been mounted, the operator or controller may commence spraying cleaning chemistry from nozzles 408 against the chamber component 404. Component holding devices 406 may be connected to a rotating device (not shown) which may rotate the chamber component 404 so that all sides of chamber component 404 may be sprayed with cleaning chemistry. Cleaning chemistry may fall to the bottom of tank 402 and be collected by drain 418, from which the cleaning chemistry may be pumped through conduit 416 by pump 414. The cleaning chemistry may be pumped directly through conduit 412 to cleaning chemistry source 410, or may first be filtered and/or reconditioned prior to being returned to cleaning chemistry source 410.

During the spraying operation, the temperature of the chamber component 404 may be measured by sensor 420, and reported to controller 424 over signal line 422. If the temperature of the chamber component 404 exceeds a target temperature or temperature range, the controller may command a decrease in the rate of flow of cleaning chemistry from the nozzles 408. Similarly, if the temperature of the chamber component 404 falls below a target temperature or temperature range, the controller may command an increase in the rate of flow of cleaning chemistry from the nozzles 408. As discussed above, the temperature of the chamber component 404 may be measured directly. In addition, the temperature of the chamber component 404 may be indirectly measured by measuring the temperature of the cleaning chemistry which falls to the bottom of the tank 402.

If the temperature of the chamber component 404 cannot be raised into the acceptable temperature range by simply increasing the flow rate of cleaning chemistry, the cleaning chemistry may be preheated before it is sprayed on the cleaning chamber 404.

The nozzles 408 may be controlled as a group or may be individually controlled in order to place additional cleaning chemistry on portions of the chamber component 404 which have a greater amount of unintended coating 106, and to place less cleaning chemistry on portions of the chamber component 404 which have a lesser amount of unintended coating 106.

Figure 5:
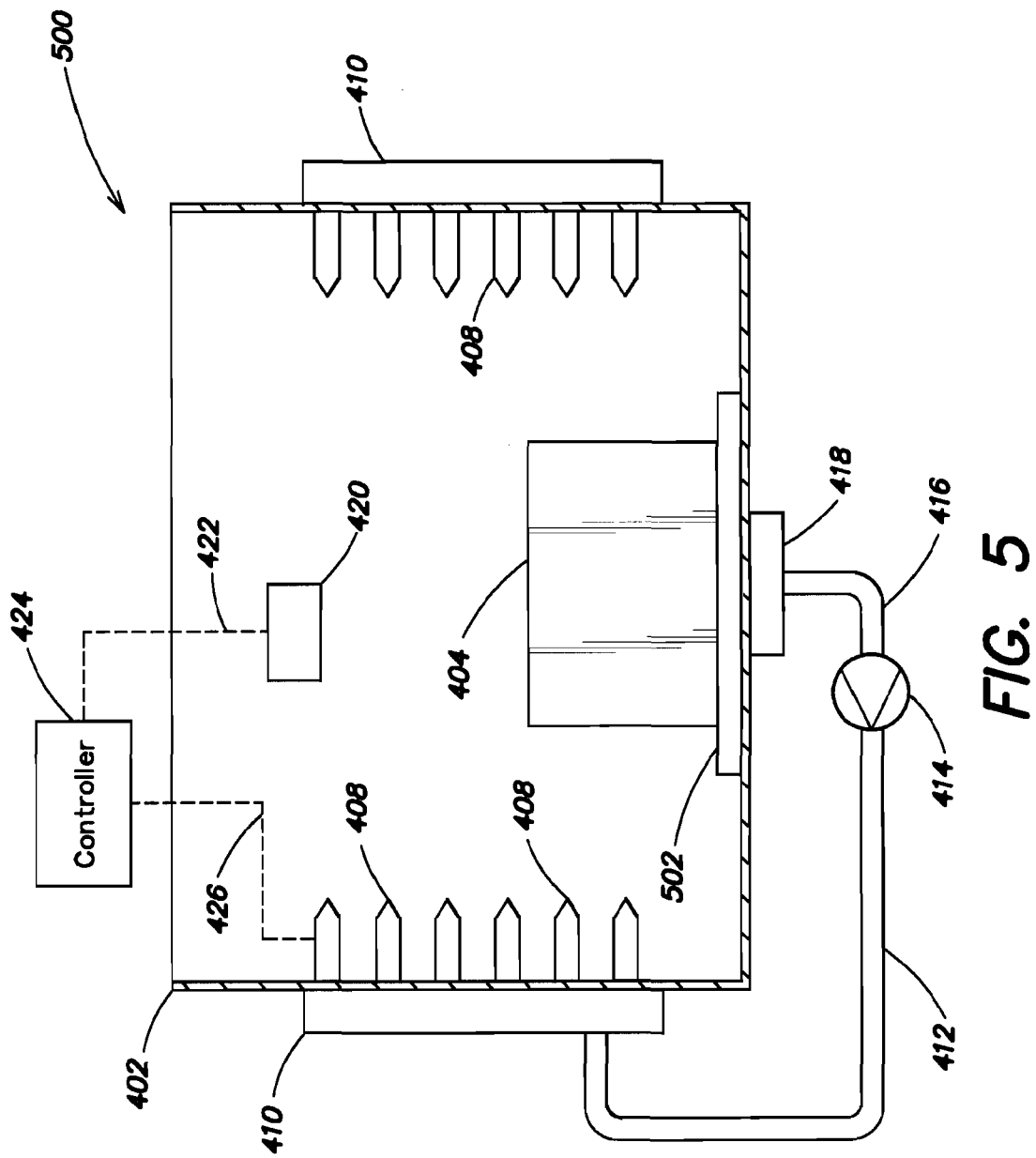
FIG. 5 is a schematic drawing of another chamber component spraying apparatus of the invention.

FIG. 5 is a schematic drawing of another spraying apparatus 500 of the present invention. Spraying apparatus 500 may be substantially similar to spraying apparatus 400 of FIG. 4, with the following differences. In spraying apparatus 500, the chamber component 404 is not suspended and/or raised by component holding devices 406. Instead, chamber component 404 may be placed upon turntable 502. Turntable 502 may be used to rotate the chamber component 404.

In operation, the spraying apparatus 500 may be operated similarly to the spraying apparatus 400 of FIG. 4, with the following differences. In the spraying apparatus 500 of FIG. 5, the chamber component 404 may be placed on a turntable 502 rather than suspended from component holding devices 406. The turntable 502 may rotate which in turn may rotate chamber component 404 so that cleaning chemistry which may be sprayed from nozzles 408 may reach all exterior portions of chamber component 404.

Figure 6:
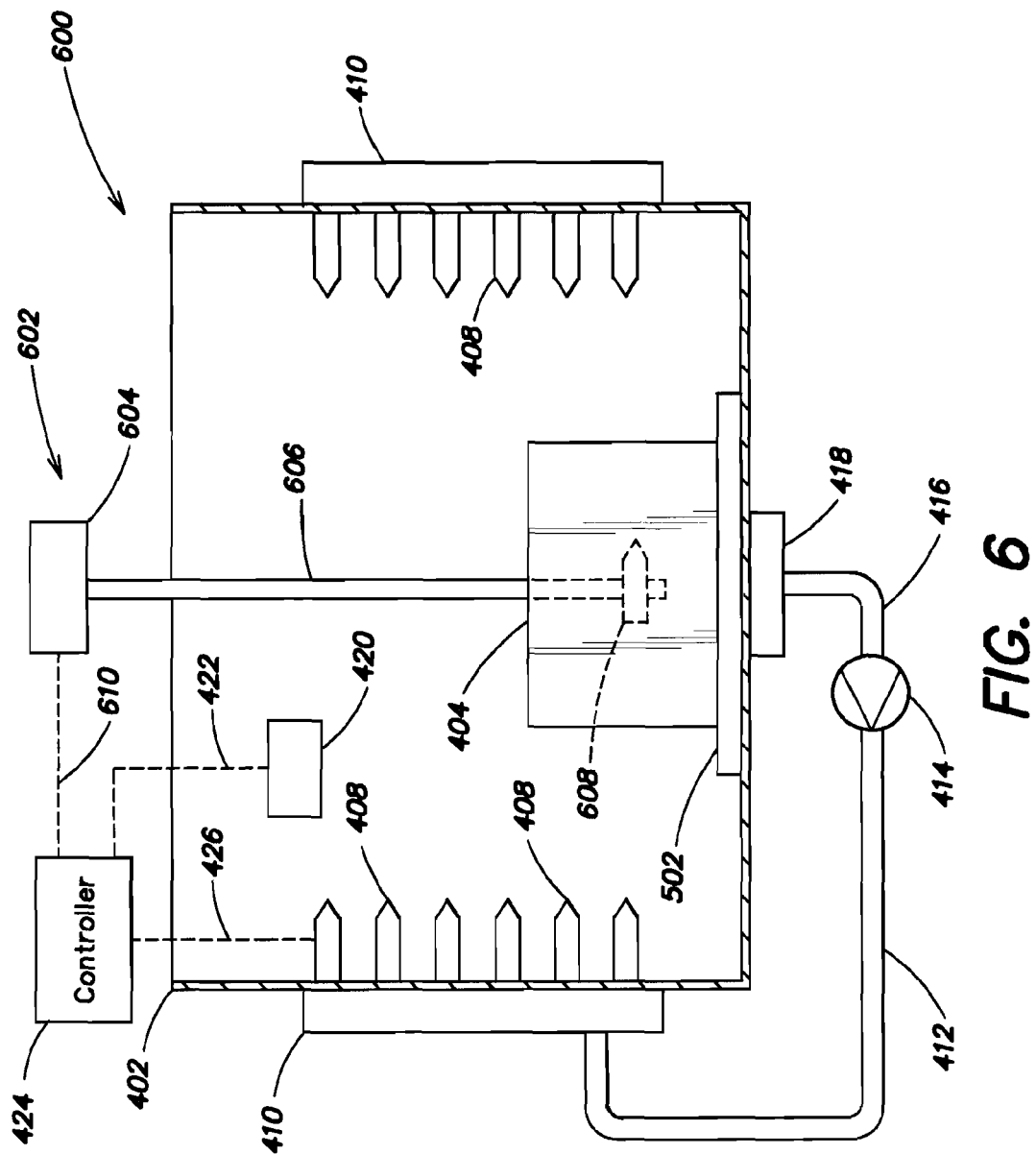
FIG. 6 is a schematic drawing of another chamber component spraying apparatus of the invention.

FIG. 6 is a schematic drawing of yet another spraying apparatus 600 of the present invention. Spraying apparatus 600 may be substantially similar to the spraying apparatus 500 of FIG. 5, with the following exceptions. Spraying apparatus 600 may have an interior spray assembly 602. The interior spray assembly 602 may include a cleaning chemistry source 604 connected through a conduit/support member 606 to a nozzle 608. Nozzle 608 may be similar to nozzle 408. The nozzle 608 may be movably and/or rotatably mounted on conduit/support member 606. In addition, or alternatively, the conduit/support member 606 may be adapted to move the nozzle 608 vertically and or rotationally. Although only one nozzle 608 is shown, it is to be understood that a plurality of nozzles 608 may be used and attached to conduit/support member 606.

The controller 424 may be connected to the cleaning chemistry source 604 by control line 610.

Although the spraying apparatus 600 as depicted in FIG. 6 may be based on the spraying apparatus 500 of FIG. 5, it should be understood that the spraying apparatus 400 of FIG. 4 may be similarly modified. Thus, spraying apparatus 400 may be modified to include an interior spray assembly 602 that is adapted to spray cleaning solution on the interior of chamber component 404 while the component holding devices 406 rotate the chamber component 404.

In operation, the spraying apparatus 600 may be operated similarly to the spraying apparatus 400 of FIG. 4 and the spraying apparatus 500 of FIG. 5, with the additional functionality described herein. The spraying apparatus 600 of FIG. 6 may spray cleaning chemistry on the interior portions of chamber component 404 through the nozzle 608. Cleaning chemistry may flow from cleaning chemistry source 604 through the conduit 606 to the nozzle 608. The interior spray assembly 602 may be operated independently of the nozzles 408. Alternatively, the interior spray assembly 602 may be operated in conjunction with the nozzles 408.

During the spraying operation, the nozzle 608 may rotate so that all interior portions of the chamber component 404 may be sprayed with cleaning composition. The rotation of the nozzle 608 may be accomplished by rotating the conduit/support member 606 or by any other suitable method. In addition, the nozzle 608 may be moved in the vertical direction by raising or lowering the conduit/support member 606, or by any other suitable method.

Figure 7:
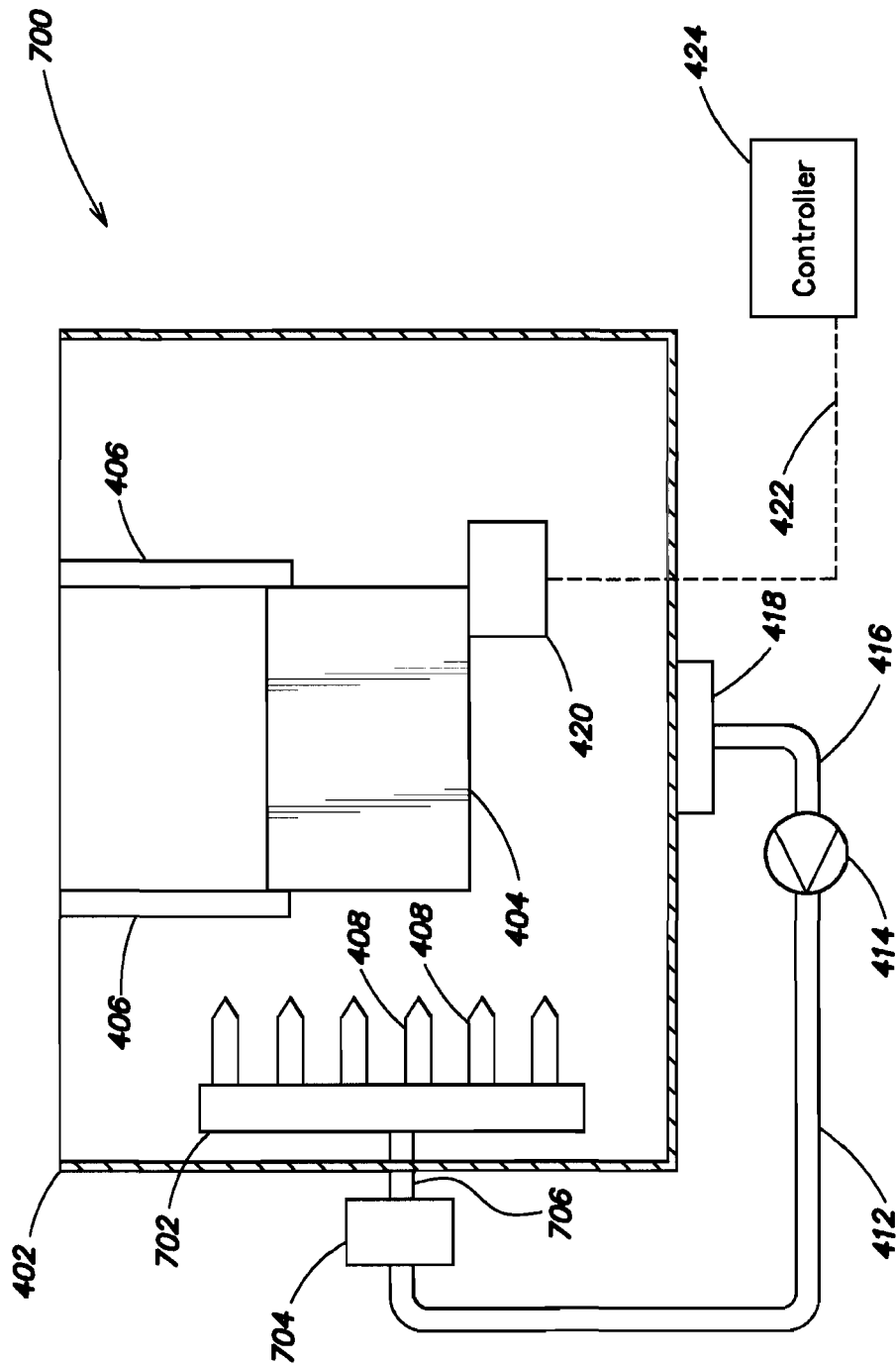
FIG. 7 is a schematic drawing of another chamber component spraying apparatus of the invention.

FIG. 7 is a schematic drawing of still another spraying apparatus 700 of present invention. The spraying apparatus 700 may be substantially similar to the spraying apparatus 400 of FIG. 4 with the following exceptions. Whereas the spray nozzles 408 of FIG. 4 may be mounted on the interior walls of the tank 402, the nozzles 408 of FIG. 7 may be mounted on arm 702. The arm 702 may be mounted on a robot arm (not shown) or a track (not shown) which may run around the bottom of the tank 402. Thus, the arm 702 may be moved around the chamber component 404 in order to allow cleaning chemistry to reach all exterior portions of the chamber component 404 from a plurality of directions. The spraying apparatus 700 may also include a cleaning chemistry source 704 which may be connected to the arm 702 through a conduit 706. The conduit 706 may be a flexible hose in order to enable the arm 702 to be moved around the inside of the tank 402.

In FIG. 7, the arm is shown on the left side of the apparatus. From that location, an arm could sweep linearly from one side of the apparatus to another, or an arm could spin while staying in the same location. Furthermore, an arm could linearly sweep across the apparatus while simultaneously spinning on one of its axes. A moveable arm could also be located on the top or bottom of the apparatus in addition to the sides. A combination of stationary and moveable nozzles is also possible within the apparatus. Different nozzles or sets of nozzles may be controlled independently. Independent control allows a nozzle or set of nozzles to treat the thickly accumulated areas for a longer time or at a faster chemical flow rate in order to more effectively clean the component. Effectively cleaning includes both removal of unwanted material without over-etching, and cleaning in the shortest possible time. Additionally, the spraying apparatus may gather sprayed chemical from the bottom of the apparatus and pump it with one or more pumps 414 to be recycled.

While the figures show the bottom of the tank 402 as flat, it could be slanted or otherwise configured to aid collection of the chemical. The recycled chemical may be immediately reused in the process, filtered (chemically and/or mechanically) and immediately reused, or pumped to a recycling station for treatment prior to reuse.

In operation, the spraying apparatus 700 of FIG. 7 may be operated similarly to the spraying apparatus 400 of FIG. 4, with the following differences. In FIG. 4, the chamber component 404 may be rotated so that the nozzles 408 may reach all portions of the exterior of the chamber component 404. In FIG. 7, the chamber component 404 may be held stationary by component holding devices 406 and the nozzles 408, which may be mounted on arm 702, may be moved laterally, vertically and/or rotationally to reach all exterior portions of the chamber component 404.

In all of the embodiments described above, the nozzles 408 may be independently controlled so that more or less cleaning chemistry may be sprayed on portions of the chamber component 404 which have more or less unintentional coating 106 there on.

The foregoing description discloses only exemplary embodiments of the invention. Modifications of the above disclosed apparatus and methods which fall within the scope of the invention will be readily apparent to those of ordinary skill in the art.

The invention claimed is:

1. A method of cleaning an electronic device manufacturing process chamber part, a first portion of the process chamber part being coated with more of a material to be cleaned than a second portion of the process chamber component, the method comprising:
   spraying the part with an acid, wherein spraying the part with an acid comprises directing the acid spray toward the first portion of the part to be cleaned in at least one of: (i) in an amount greater than an amount of the acid spray that is directed toward the second portion of the part; (ii) over a longer time than a time over which the acid spray is directed toward the second portion of the part; and (iii) at a faster flow rate than a flow rate at which the acid spray is directed toward the second portion of the part;
   measuring the temperature of the part;
   comparing the measured temperature to a desired temperature selected to provide a favorable part cleaning rate to part etching rate ratio;
   increasing or decreasing the flow rate of acid to increase or decrease the temperature of the part to maintain the part at the desired temperature;
   spraying the part with de-ionized water; and
   treating the part with potassium hydroxide.

2. The method of claim 1 wherein the acid comprises a mixture of acids.

3. The method of claim 1 where a metal film is cleaned from the part.

4. The method of claim 1 where a silicon compound is cleaned from the part.

5. The method of claim 1 wherein the step of spraying the part with an acid further comprises using the part as a containment chamber.

6. The method of claim 1 wherein the step of spraying the part with an acid further comprises placing the part on a turntable and rotating the turntable.

7. The method of claim 1 wherein the acid is heated prior to spraying the part with the acid.

8. The method of claim 1, wherein a portion of the part is masked prior to spraying the part with the acid.

9. The method of claim 1 wherein the step of spraying the part with de-ionized water comprises spraying the water at a pressure of between about 500 and about 2000 p.s.i.

10. The method of claim 9 wherein the de-ionized water is sprayed at a pressure of about 1000 p.s.i.

* * * * *